United States Patent
Yeh

(10) Patent No.: US 10,997,067 B2
(45) Date of Patent: May 4, 2021

(54) DATA STORING METHOD, MEMORY CONTROLLING CIRCUIT UNIT AND MEMORY STORAGE DEVICE

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/209,986

(22) Filed: Dec. 5, 2018

(65) Prior Publication Data
US 2020/0133835 A1 Apr. 30, 2020

(30) Foreign Application Priority Data

Oct. 25, 2018 (TW) ................................ 107137848

(51) Int. Cl.
*G06F 12/02* (2006.01)
*G06F 3/06* (2006.01)
(Continued)

(52) U.S. Cl.
CPC ........ *G06F 12/0246* (2013.01); *G06F 3/0616* (2013.01); *G06F 3/0649* (2013.01);
(Continued)

(58) Field of Classification Search
CPC .. G06F 12/0246; G06F 3/0616; G06F 3/0649; G06F 3/0679; G06F 2212/401; G11C 29/52
See application file for complete search history.

(56) References Cited

U.S. PATENT DOCUMENTS

2013/0227203 A1* 8/2013 Marotta .............. G06F 12/0246
711/103
2014/0250257 A1* 9/2014 Khan ..................... G11C 16/10
711/103
(Continued)

FOREIGN PATENT DOCUMENTS

| CN | 103631529 | 3/2014 |
| CN | 105630687 | 6/2016 |

(Continued)

OTHER PUBLICATIONS

"Office Action of China Counterpart Application", dated Nov. 2, 2020, p. 1-p. 8.
(Continued)

*Primary Examiner* — Michelle T Bechtold
(74) *Attorney, Agent, or Firm* — JCIPRNET

(57) ABSTRACT

A data storing method, a memory controlling circuit unit and a memory storage device are provided. The method includes: receiving a first data; determining whether a wear degree value of a rewritable non-volatile memory module is less than a threshold; if the wear degree value of the rewritable non-volatile memory module is less than the threshold, storing the first data into the rewritable non-volatile memory module by using a first mode; and if the wear degree value of the rewritable non-volatile memory module is not less than the threshold, storing the first data into the rewritable non-volatile memory module by using a second mode. A reliability of the first data stored by using the first mode is higher than a reliability of the first data stored by using the second mode.

18 Claims, 12 Drawing Sheets

(51) Int. Cl.
*G11C 16/34* (2006.01)
*G11C 29/52* (2006.01)
*G11C 11/56* (2006.01)

(52) U.S. Cl.
CPC ........ *G06F 3/0679* (2013.01); *G11C 11/5635* (2013.01); *G11C 16/349* (2013.01); *G11C 29/52* (2013.01); *G06F 2212/401* (2013.01); *G06F 2212/403* (2013.01); *G06F 2212/7211* (2013.01)

(56) References Cited

U.S. PATENT DOCUMENTS

| | | | |
|---|---|---|---|
| 2016/0188405 A1* | 6/2016 | Li | G06F 11/1048 714/755 |
| 2016/0299850 A1* | 10/2016 | Budiman | G06F 3/068 |
| 2018/0107391 A1* | 4/2018 | Hashimoto | G11C 16/10 |
| 2018/0217751 A1* | 8/2018 | Agarwal | G06F 3/0616 |
| 2019/0095116 A1* | 3/2019 | Igahara | G06F 12/10 |

FOREIGN PATENT DOCUMENTS

| | | |
|---|---|---|
| CN | 107544922 | 1/2018 |
| CN | 108664350 | 10/2018 |

OTHER PUBLICATIONS

"Office Action of China Counterpart Application", dated Mar. 5, 2021, p. 1-p. 12.

* cited by examiner

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 5B

DATA STORING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 107137848, filed on Oct. 25, 2018. The entirety of the above-mentioned patent application is hereby incorporated by reference herein and made a part of this specification.

BACKGROUND

Technical Field

The invention relates to a data storing method, a memory controlling circuit unit and a memory storage device.

Description of Related Art

Digital cameras, cell phones, and MP3 players have undergone rapid growth in recent years, so that consumers' demands for storage media have also been increased drastically. Due to having the characteristics of non-volatility of data, low power consumption, small volume, non-mechanical structure, and fast reading and writing speed, the rewritable non-volatile memory is the most adaptable memory applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

According to the number of bits which each memory cell thereof is capable of storing, an NAND flash memory may be classified into a Single Level Cell (SLC) NAND flash memory, a Multi Level Cell (MLC) NAND flash memory, or a Trinary Level Cell (TLC) NAND flash memory. Specifically, each memory cell in the SLC NAND flash memory can store one bit of data (i.e., "1" or "0"), each memory cell in the MLC NAND flash memory can store two bits of data, and each memory cell in the TLC NAND flash memory can store three bits of data.

In the NAND flash memory, a physical programming unit is composed of several memory cells arranged on the same word line. Since each memory cell in the SLC NAND flash memory can store one bit of data, several memory cells arranged on the same word line in the SLC NAND flash memory correspond to one physical programming unit.

By contrast, a floating gate storage layer in each memory cell of the MLC NAND flash memory can store two bits of data, and each storage state (i.e., "11," "10," "01," or "00") includes the least significant bit (LSB) and the most significant bit (MSB). For instance, the first bit from the left of the storage states is the LSB, and the second bit from the left of the storage states is the MSB. Accordingly, several memory cells arranged on the same word line may constitute two physical programming units, and therein, the physical programming unit constituted by the LSB and the MSB of the memory cell are a lower physical programming unit and an upper physical programming unit, respectively. In particular, the speed of writing data into the lower physical programming unit is faster than writing data into the upper physical programming unit, and when a program failure occurs in the process of programming the upper physical programming unit, the data stored in the lower physical programming unit may be lost.

Similarly, each memory cell in the TLC NAND flash memory can store three bits of data, and each storage state (i.e., "111," "110," "101," "100," "011," "010," "001," or "000") includes the first bit (i.e., the LSB), the second bit (i.e., the center significant bit, CSB), and the third bit (i.e., the MSB) from the left of the storage states. Accordingly, several memory cells arranged on the same word line may constitute three physical programming units, and therein, the physical programming unit constituted by the LSB is a lower physical programming unit, the physical programming unit constituted by the CSB is a middle physical programming units, and the physical programming unit constituted by the MSB of the memory cells is an upper physical programming unit. Specifically, when programming the memory cells on the same word line, only one of merely programming the lower physical programming unit or simultaneously programming the lower physical programming unit, the middle physical programming unit and the upper physical programming unit can be selected; otherwise, the stored data may be lost.

Generally, a rewritable non-volatile memory have multiple physical erasing units. Each of the physical erasing units is composed of a plurality of physical programming units. Before producing a memory storage device with the rewritable non-volatile memory, the manufacturer of the memory storage device (or the supplier of the rewritable non-volatile memory) needs to test the rewritable non-volatile memory in order to remove the physical erasing unit that has problems (e.g., being damaged or with high error rate) in the rewritable non-volatile memory. It should be noted that during the test, the rewritable non-volatile memory should be programmed or erased repeatedly. However, since the number of programming and erasure of a rewritable non-volatile memory is limited, repeated testing of rewritable non-volatile memory may result in a decrease in the life of the rewritable non-volatile memory.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data storing method, a memory controlling circuit unit, and a memory storage device, which can directly use a rewritable non-volatile memory module without extensive testing of the rewritable non-volatile memory module and ensure the correctness of the data stored in the rewritable non-volatile memory module.

According to an exemplary embodiment of the present invention, a data storing method for a rewritable non-volatile memory module is provided. The data storing method includes: receiving a first data; determining whether a wear degree value of the rewritable non-volatile memory module is less than a threshold; if the wear degree value of the rewritable non-volatile memory module is less than the threshold, storing the first data into the rewritable non-volatile memory module by using a first mode; and if the wear degree value of the rewritable non-volatile memory module is not less than the threshold, storing the first data into the rewritable non-volatile memory module by using a second mode, wherein a reliability of the first data stored by using the first mode is higher than a reliability of the first data stored by using the second mode.

According to an exemplary embodiment of the present invention, a memory controlling circuit unit for a rewritable non-volatile memory module is provided. The memory controlling circuit unit includes: a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured to perform the following operations: receiving a first data; determining whether a wear degree value of the rewritable non-volatile memory module is less than a threshold; if the wear degree value of the rewritable non-volatile memory module is less than the threshold, storing the first data into the rewritable non-volatile memory module by using a first mode; and if the wear degree value of the rewritable non-volatile memory module is not less than the threshold, storing the first data into the rewritable non-volatile memory module by using a second mode, wherein a reliability of the first data stored by using the first mode is higher than a reliability of the first data stored by using the second mode.

According to an exemplary embodiment of the present invention, a memory storage device is provided. The memory storage device includes a connection interface unit, a rewritable non-volatile memory module and a memory controlling circuit unit. The connection interface unit is configured to couple to a host system. The memory controlling circuit unit is coupled to the connection interface unit and the rewritable non-volatile memory module. The memory controlling circuit unit is configured to perform the following operations: receiving a first data; determining whether a wear degree value of the rewritable non-volatile memory module is less than a threshold; if the wear degree value of the rewritable non-volatile memory module is less than the threshold, storing the first data into the rewritable non-volatile memory module by using a first mode; and if the wear degree value of the rewritable non-volatile memory module is not less than the threshold, storing the first data into the rewritable non-volatile memory module by using a second mode, wherein a reliability of the first data stored by using the first mode is higher than a reliability of the first data stored by using the second mode.

Based on the above, the data storing method, the memory controlling circuit unit, and the memory storage device of the present invention can directly use a rewritable non-volatile memory module without extensive testing of the rewritable non-volatile memory module and ensure the correctness of the data stored in the rewritable non-volatile memory module.

To make the aforementioned more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A and FIG. 5B are schematic diagrams illustrating examples of a storage structure of a memory cell and physical erasing units according to an exemplary embodiment of the present invention.

DESCRIPTION OF THE EMBODIMENTS

Figure 1:
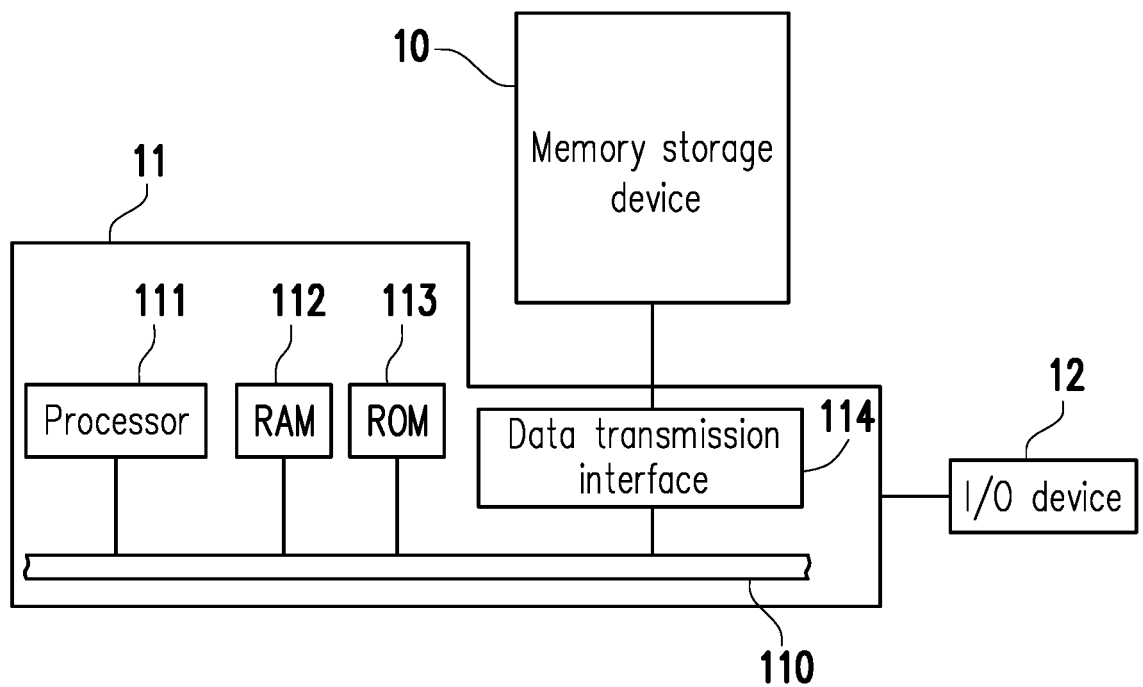
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
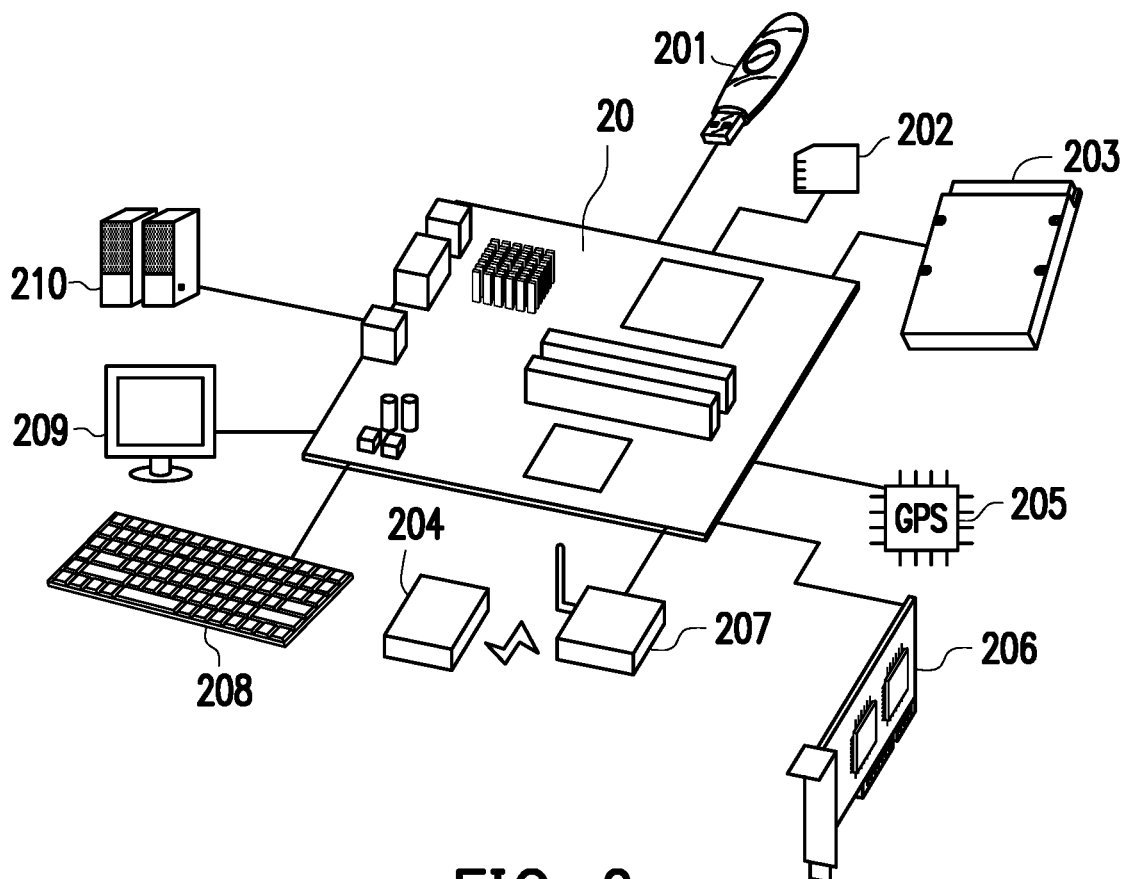
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
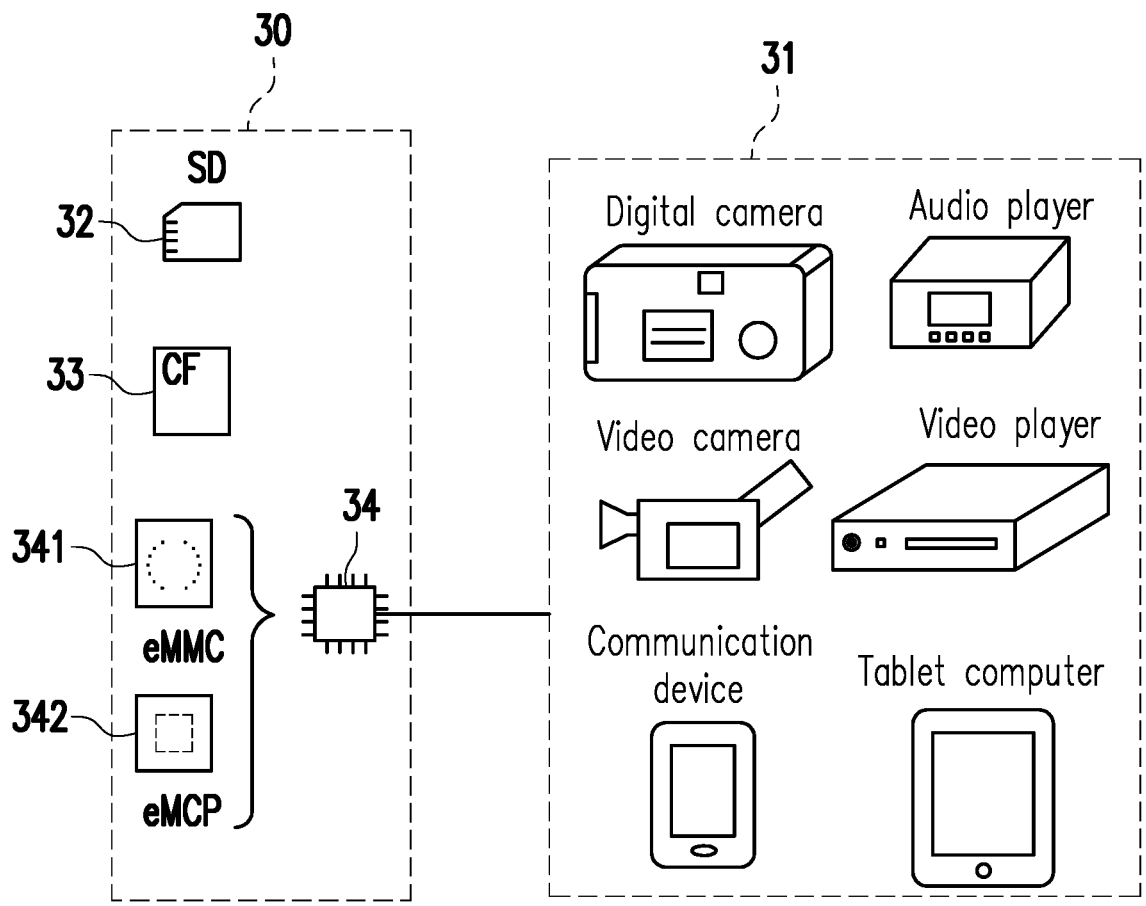
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, and a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
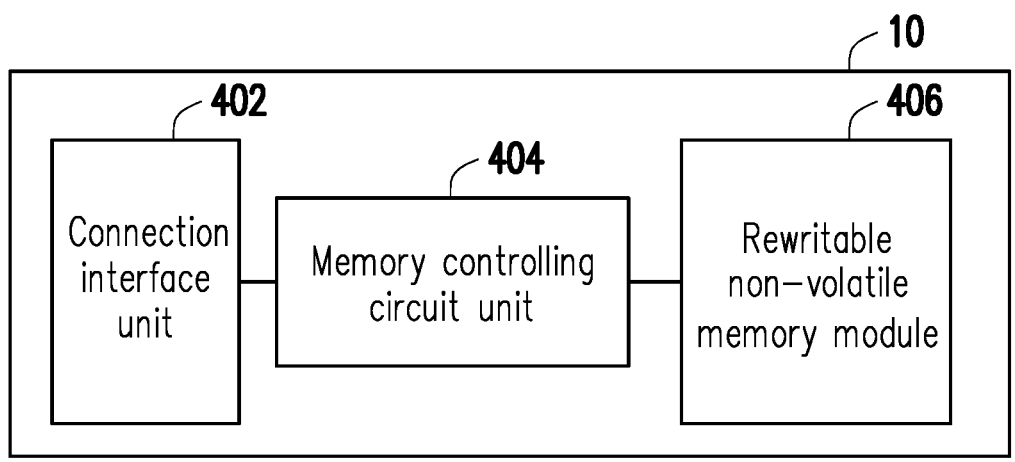
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In this embodiment, the connection interface unit 402 is compatible with a SATA (Serial Advanced Technology Attachment) standard. Nevertheless, it should be understood that the invention is not limited in this regard. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware from or in a firmware from and perform operations of writing, reading or erasing data in the rewritable non-volatile memory module 406 according to the commands of the host system 11.

The rewritable non-volatile memory module 406 is coupled to the memory controlling circuit unit 404 and configured to store data written from the host system 11. The rewritable non-volatile memory module 406 has physical erasing units 510(0) to 510(N). For instance, the physical erasing units 510(0) to 510(N) may belong to the same memory die or belong to different memory dies. Each physical erasing unit has a plurality of physical programming units. For example, in the present exemplary embodiment, each physical erasing unit contains 258 physical programming units, and physical programming units belonging to the same physical erasing unit may be written independently and erased simultaneously. However, it is to be understood that the present invention is not limited thereto, and each physical erasing unit may contain 64 physical programming units, 256 physical programming units or any number of physical programming units.

To be more detailed, a physical erasing unit is the smallest is the smallest unit for erasing data, namely, each physical erasing unit contains the least number of memory cells that are erased all together. A physical programming unit is the smallest unit for programming data, namely, each physical programming unit is the smallest unit for writing data. Each physical programming unit commonly includes a data bit area and a redundant bit area, and the data bit area includes a plurality of physical access addresses for storing data of users, and the redundant bit area is configured for storing system data (e.g., control information and error correcting codes). In the present exemplary embodiment, each data bit area of the physical programming units contains 4 physical access addresses, and the size of each physical access address is 512 bytes. However, in other exemplary embodiments, more or less number of the physical access addresses may be contained in the data bit area, and the amount and the size of the physical access addresses are not limited in the present invention.

In the present exemplary embodiment, the rewritable non-volatile memory module 406 is a trinary-level cell (TLC) NAND flash memory module (i.e., a flash memory module capable of storing data of 3 bits in one memory cell). However, the present invention is not limited thereto, and the rewritable non-volatile memory module 406 may also be a multi-level cell (MLC) NAND flash memory module (i.e., a flash memory module capable of storing data of 2 bits in one memory cell), other flash memory modules, or other memory modules having the same characteristics.

Figure 5A:
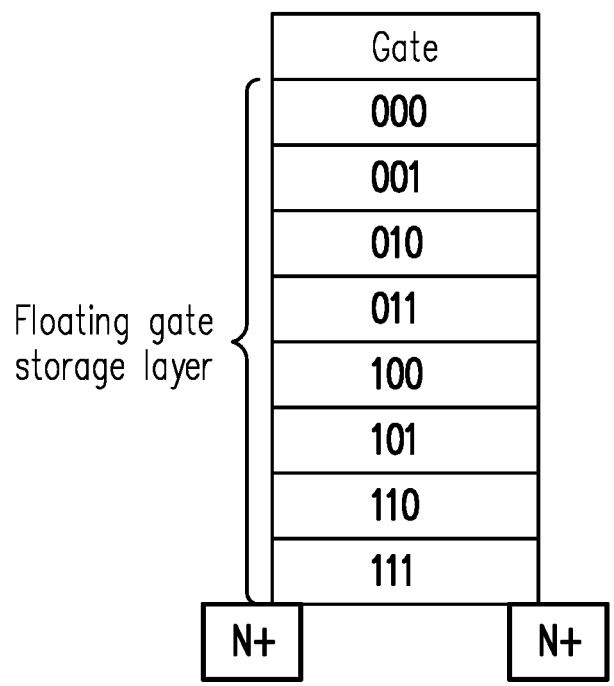

FIG. 5A and FIG. 5B are schematic diagrams illustrating examples of a storage structure of a memory and physical erasing units according to an exemplary embodiment of the present invention.

With reference to FIG. 5A, a storage state of each memory cell of the rewritable non-volatile memory module 406 can be recognized as "111", "110", "101", "100", "011", "010", "001" or "000" (shown in FIG. 3A), in which a first bit counted from the left is a least significant bit (LSB), a second bit counted from the left is a center significant bit (CSB) and a third bit counted from the left is a most significant bit (MSB). Moreover, a plurality of memory cells arranged on a same word line may from 3 physical programming units, where the physical programming unit formed by the LSBs of the memory cells is referred to as a lower physical programming unit, the physical programming unit formed by the CSBs of the memory cells is referred to as a middle physical programming unit, and the physical programming unit formed by the MSBs of the memory cells is referred to as an upper physical programming unit.

With reference to FIG. 3B, a physical erasing unit is composed of a plurality of physical programming unit groups, where each of the physical programming unit groups includes a lower physical programming unit, a middle physical programming unit and an upper physical programming unit formed by a plurality of memory cells arranged on a same word line. For instance, in the physical erasing unit, a $0^{th}$ physical programming unit belonging to the lower physical programming unit, a $1^{st}$ physical programming unit belonging to the middle physical programming units and a $2^{nd}$ physical programming unit belonging to the upper physical programming unit are regarded as one physical programming unit group. Similarly, the $3^{rd}$, $4^{th}$ and $5^{th}$ physical programming units are regarded as one physical programming unit group, and deduced by analogy, the other physical programming units are also grouped into a physical programming unit group according to such manner.

Figure 6A:
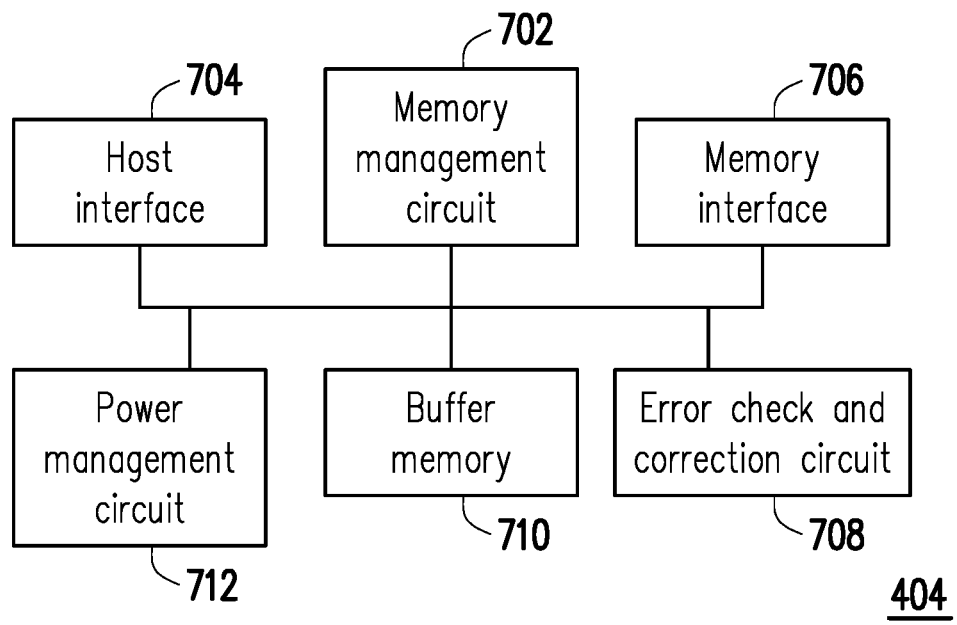
FIG. 6A is a schematic block diagram illustrating a memory controlling circuit unit according to an exemplary embodiment of the invention.

FIG. 6A is a schematic block diagram illustrating a memory controlling circuit unit according to an exemplary embodiment of the invention.

Referring to FIG. 6A, the memory controlling circuit unit 404 includes a memory management circuit 702, a host interface 704, a memory interface 706 and an error check and correction circuit 708.

The memory management circuit 702 is configured to control overall operations of the memory controlling circuit unit 404. Specifically, the memory management circuit 702 has a plurality of control commands. When the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 702 when the memory controlling circuit unit 404 is enabled. Then, the control commands are executed by the microprocessor unit to perform operations, such as writing, reading or erasing data.

Further, in another exemplary embodiment, the control commands of the memory management circuit 702 may also be implemented in form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In this exemplary embodiment, the host interface 704 is compatible with the SATA standard. Nevertheless, it should be understood that the invention is not limited in this regard. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data transmitted in the bus. The signals or the data may include command codes and program codes. For example, information such as identification codes and memory addresses are included in the read command sequence.

The error check and correction circuit 708 is coupled to the memory management circuit 702 and configured to perform an error check and correction operation to ensure integrity of data. Specifically, when the memory management circuit 702 receives the write command from the host system 11, the error check and correction circuit 708 generates an ECC (error correcting code) and/or an EDC (error detecting code) for data corresponding to the write command, and the memory management circuit 702 writes data and the ECC and/or the EDC corresponding to the write command into the rewritable non-volatile memory module 406. Later, when reading the data from the rewritable non-volatile memory module 406, the memory management circuit 702 will read the corresponding ECC and/or the EDC, and the error check and correction circuit 708 will perform the error check and correction operation on the read data based on the ECC and/or the EDC.

In an exemplary embodiment, the memory controlling circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

In this exemplary embodiment, the error check and correction circuit 708 can perform a single-frame encoding for the data stored in the same physical programming unit and can also perform a multi-frame encoding for data stored in multiple physical programming units. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, more of other encoding algorithms not listed above may also be adopted, which are omitted herein. According to the adopted encoding algorithm, the error check and correction circuit 708 can encode the data to be protected, so as to generate the corresponding ECC and/or the EDC. For descriptive convenience, the ECC and/or the EDC generated by encoding are collectively referred to as encoded data.

It is noted that in the following description, some Willis may be replaced with corresponding abbreviations for ease of reading (see Table 1).

TABLE 1

| rewritable non-volatile memory module | RNVM module |
| --- | --- |
| physical programming unit | PPU |
| physical erasing unit | PEU |
| memory management circuit | MMC |

Figure 6B:
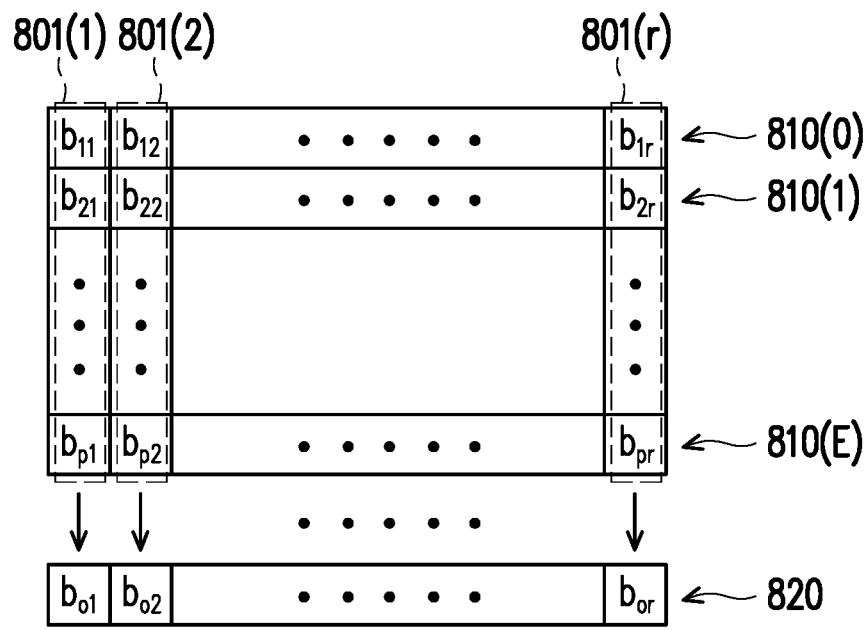
FIG. 6B is a schematic diagram illustrating a multi-frame encoding according to an exemplary embodiment of the invention.

FIG. 6B is a schematic diagram illustrating a multi-frame encoding according to an exemplary embodiment of the invention.

With reference to FIG. 6B that takes encoded data 820 correspondingly generated by encoding the data stored in PPUs 810(0) to 810(E) as an example, in which at least a part of data stored by each of the PPUs 810(0) to 810(E) may be regarded as one frame. In the multi-frame encoding, the data in the PPUs 810(0) to 810(E) are encoded based on each of positions where bits (or bytes) are located. For example, bits $b_{11}, b_{21}, \ldots, b_{p1}$ at a position 801(1) are encoded as a bit $b_{o1}$ in the encoded data 820 and bits $b_{12}, b_{22}, \ldots, b_{p2}$ at a position 801(2) are encoded as a bit $b_{o2}$ in the encoded data 820; and by analogy, bits $b_{1r}, b_{2r}, \ldots, b_{pr}$ at a position 801(r) are encoded as a bit $b_{or}$ in the encoded data 820. Later, the data read from the PPUs 810(0) to 810(E) may be decoded according to the encoded data 820 so attempts on correcting possible errors in the read data can be made.

Herein, in another exemplary embodiment of FIG. 6B, the data used for generating the encoded data 820 may also include redundancy bits corresponding to the data bits of the data stored in the PPUs 810(0) to 810(E). Taking the data stored in the PPU 810(0) for example, the redundancy bits therein are, for example, generated by performing the single-frame encoding for the data bits stored in the PPU 810(0). In this exemplary embodiment, it is assumed that when the data of the PPU 810(0) is read, the data read from the PPU 810(0) may be decoded by the redundancy bits (e.g., the encoded data of the single-frame encoding) in the PPU 810(0) so as to perform the error check and correct operation. However, if a failure occurs when a decoding operation is performed by using the redundancy bits in the PPU 810(0) (e.g., a number of error bits of the data stored in the PPU 810(0) is greater than a threshold), a retry-read mechanism may be used to attempt reading correct data from the PPU 810(0). Details regarding the retry-read mechanism would be described later. When the correct data cannot be read from the PPU 810(0) by using the retry-read mechanism, the encoded data 820 and data of the PPUs 810(1) to 810(E) may be read and the decoding may be performed according to the encoded data 820 and the data of the PPUs 810(1) to 810(E) so as to attempt correcting errors included in the data stored in the PPU 810(0). In other words, in the present exemplary embodiment, if a failure occurs when the decoding is performed by using the encoded data generated by the single-frame encoding and a failure occurs when the reading is performed by using the retry-read mechanism, the encoded data generated by the multi-frame encoding is used for the decoding instead.

Figure 7:
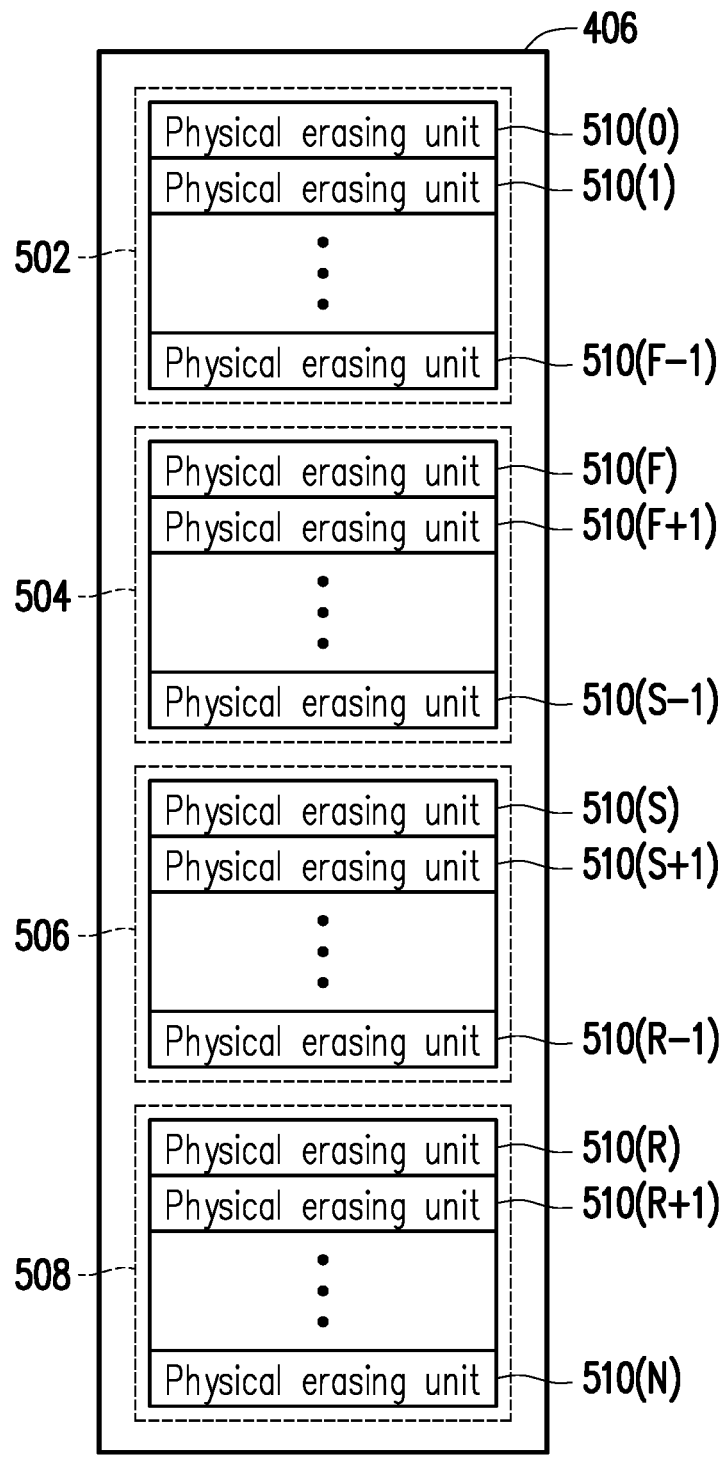
FIG. 7 and FIG. 8 are schematic diagrams illustrating examples of managing the physical erasing units according to an exemplary embodiment of the present invention.
Figure 8:
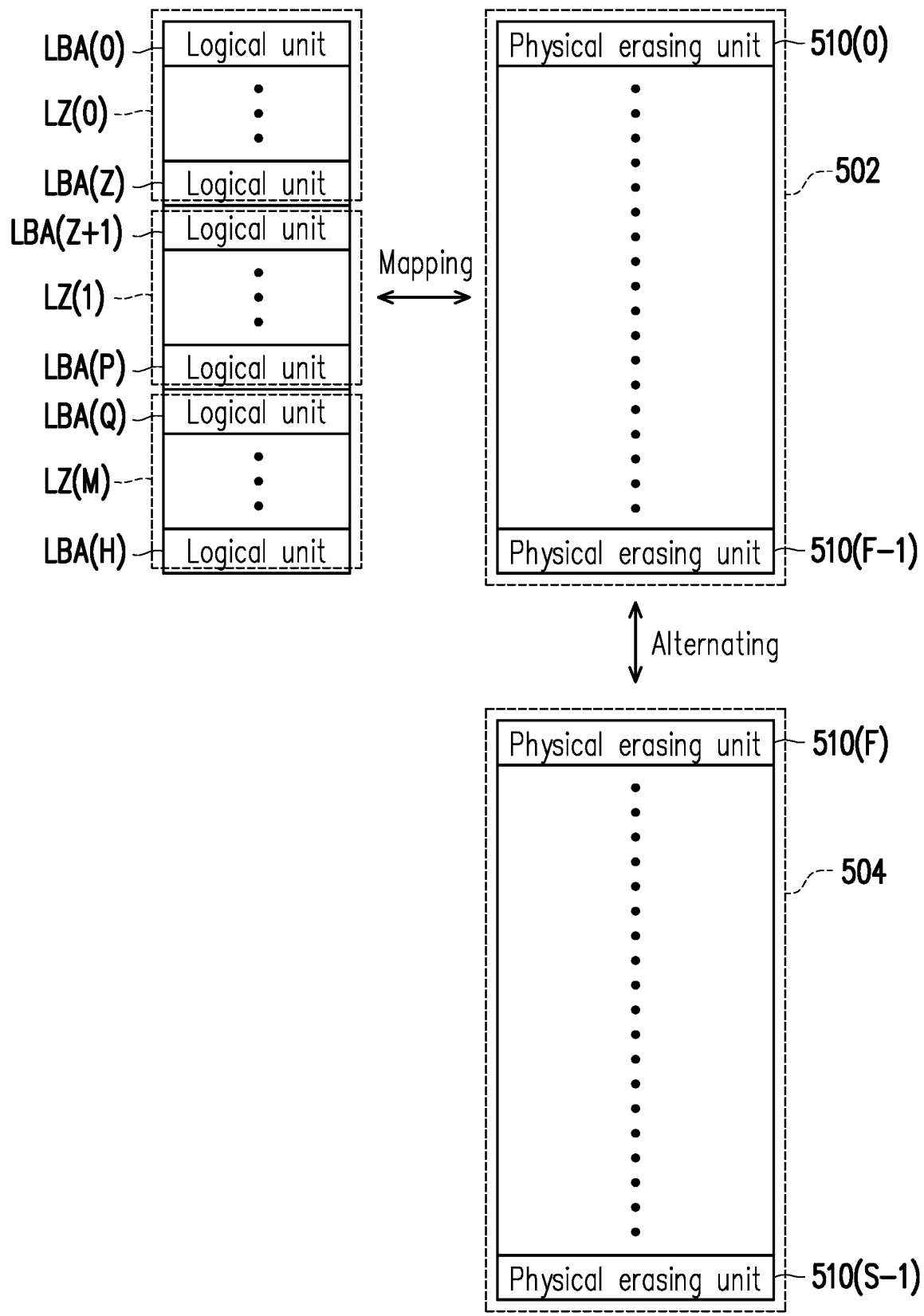

FIG. 7 and FIG. 8 are schematic diagrams illustrating examples of managing the PEUs according to an exemplary embodiment of the present invention.

With reference to FIG. 7, the RNVM module 406 has PEUs 510(0) to 510(N), and the MMC 702 logically partitions the PEUs 510(0) to 510(N) into a data area 502, a free area 504, a temporary area 506 and a replacement area 508.

The PEUs logically belonging to the data area 502 and the free area 504 are used for storing data from the host system 11. To be more specific, the PEUs belonging to the data area 502 are regarded as PEUs with data stored therein, and the PEUs belonging to the free area 504 are PEUs in replacement with the data area 502. Namely, when the host system 11 receives a write command and data to be written, the MMC 702 selects a PEU from the free area 504 and writes the data into the selected PEU so as to replace the PEU of the data area 502.

The PEUs logically belonging to the temporary area 506 are used for recording system data. For instance, the system data includes a logical address-physical address mapping table, the manufacturers and models of the RNVM module, the number of physical blocks in the RNVM modules, the number of PPUs of each PEU.

The PEUs logically belonging to the replacement area 508 are used for replacing damaged PEUs. To be more specific, if there are still normal PEUs is the replacement area 508, and a PEU in the data area 502 is damaged, the MMC 302 elects a normal PEU from the replacement area 508 to replace the damaged PEU.

Specially, the number of the PEUs belonging to the data area 502, the free area 504, the temporary area 506 and the replacement area 508 vary with different memory types. Additionally, it is to be understood that in the operation of the memory storage device 10, the PEUs associated with the data area 502, the free area 504, the temporary area 506 and the replacement area 508 are dynamically changed. For instance, when one PEU in the free area 504 is damaged and replaced by a PEU of the replacement area 508, the PEUs originally associated with the replacement area 508 is associated with the free area 504.

With reference to FIG. 8, the MMC 702 configures logical units LBA(0) to LBA(H) for mapping the PEUs belonging to the data area 502, where each logical unit has a plurality of logical sub-units to be mapped to the PPUs of the corresponding PEU. In the meantime, when the host system 11 is to write data into a logical unit or update the data stored in the logical unit, the MMC 702 selects a PEU from the free area 504 for writing data to alternatively replace the PEU of the data area 502. In the present exemplary embodiment, a logical sub-unit may be a logical page or a logical sector.

In order to identify where each logical unit of data is stored in the PEU, in the present exemplary embodiment, the MMC 702 records mapping relations between the logical units and the PEUs. When the host system 11 is about to access data in the logical sub-unit, the MMC 702 confirms the logical unit where the logical sub-units belong to and accesses data from the PEU mapped to the logical unit. For instance, in the present exemplary embodiment, the MMC 702 stores a logical address-physical address mapping table in the RNVM module 406 for recording each PEU mapped to the logical unit. When accessing data, the MMC 702 loads the logical address-physical address mapping table o the buffer memory 710 for updating.

It should be mentioned that the buffer memory 710 may be incapable of recording mapping tables recording the mapping relations of all logical units due to its limited capacity. Therefore, in the present exemplary embodiment, the MMC 702 groups the logical units LBA(0) to LBA(H) into a plurality of logical zones LZ(0) to LZ(M) and assigns one logical address mapping table to each logical zone. Specially, when the MMC 702 is going to update the mapping of a logical unit, the logical address-physical address mapping table corresponding to the logical zone of the logical unit is loaded to the buffer memory buffer memory 710 and is then updated.

Generally, before producing the memory storage device 10 with the RNVM module 406, the manufacturer of the memory storage device 10 (or the supplier of the RNVM module 406) needs to test the RNVM module 406 in order to remove the PEU that has problems (e.g., being damaged) in the RNVM module 406. It should be noted that during testing the RNVM module 406, the RNVM module 406 should be programmed or erased repeatedly. However, since the number of programming and erasure of the RNVM module 406 is limited, repeated testing of rewritable non-volatile memory may result in a decrease in the life of the rewritable non-volatile memory.

Therefore, the present invention provides a data storing method which can directly use the RNVM module 406 without extensive testing of the RNVM module 406 and ensure the correctness of the data stored in the RNVM module 406.

Figure 9:
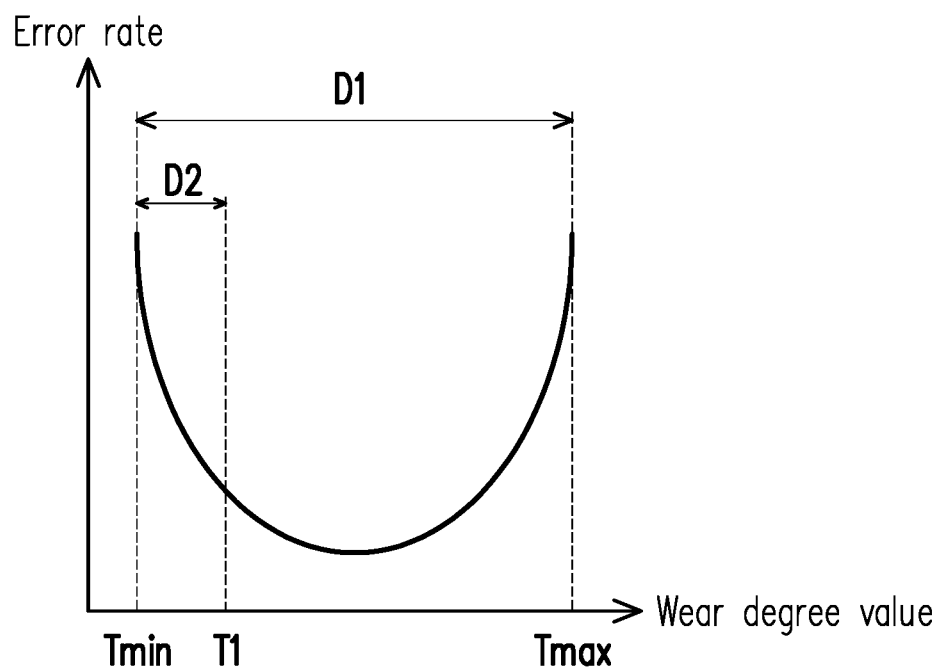
FIG. 9 is a schematic diagram illustrating a relationship between an error rate and a wear degree value according to an exemplary embodiment.

In more detail, FIG. 9 is a schematic diagram illustrating a relationship between an error rate and a wear degree value according to an exemplary embodiment. In the present exemplary embodiment, the wear degree value of the RNVM module 406 may be the number of erasing, the number of writing of all the PEUs in the RNVM module 406, and the corresponding values of one or a combination of other parameters of the RNVM module 406. The present invention does not limit the wear degree value. In the present exemplary embodiment, the wear degree value of the RNVM module 406 is the sum of the number of erases and the number of writing of all the PEUs in the RNVM module 406.

Referring to FIG. 9, in general, based on the physical characteristics of the RNVM module 406, when the wear degree value of the RNVM module 406 is less than a threshold T1, a higher error rate may be generated if the data is written into the RNVM module 406. As the wear degree value of the RNVM module 406 gradually approaches the threshold T1, the error rate gradually decreases. When the wear degree value of the RNVM module 406 is higher than the threshold T1, the error rate will be lower and tend to be stable. Thereafter, when the wear degree value of the RNVM module 406 gradually approaches the maximum wear degree value Tmax, the error rate will gradually increase.

The wear degree value of the RNVM module 406 is generally lower than the threshold T1 before testing the RNVM module 406 or merely performing a small amount of testing of the RNVM module 406. In this case, writing data to the RNVM module 406 results in a higher error rate. Therefore, in the data storing method of the present invention, when the MMC 702 intends to write (or store) a data (also referred to as a first data) into the RNVM module 406 and the wear degree value of the RNVM module 406 is less than the threshold T1, the MMC 702 would store the first data into the RNVM module 406 by using a first mode. In addition, when the MMC 702 intends to write (or store) the aforementioned first data into the RNVM module 406 and the wear degree value of the RNVM module 406 is not less than the threshold T1, the MMC 702 would store the first data into the RNVM module by using a second mode. In particular, in the present exemplary embodiment, a reliability of the first data stored by using the first mode is higher than a reliability of the first data stored by using the second mode. In other words, since the first mode has higher ability to protect data, it can solve the problem that the error rate is too high when the wear degree value is less than the threshold T1.

In the present exemplary embodiment, as shown in FIG. 9, the RNVM module 406 has a minimum wear degree value Tmin and a maximum wear degree value Tmax. The minimum wear degree value Tmin differs from the maximum wear degree value Tmax by a first value D1. The aforementioned threshold T1 differs from the minimum wear degree value Tmin by a second value D2. In the present exemplary embodiment, the second value D2 is one tenth of the first value D1. However, the present invention is not intended to limit the ratio between the second value D2 and the first value D1.

Figure 10:
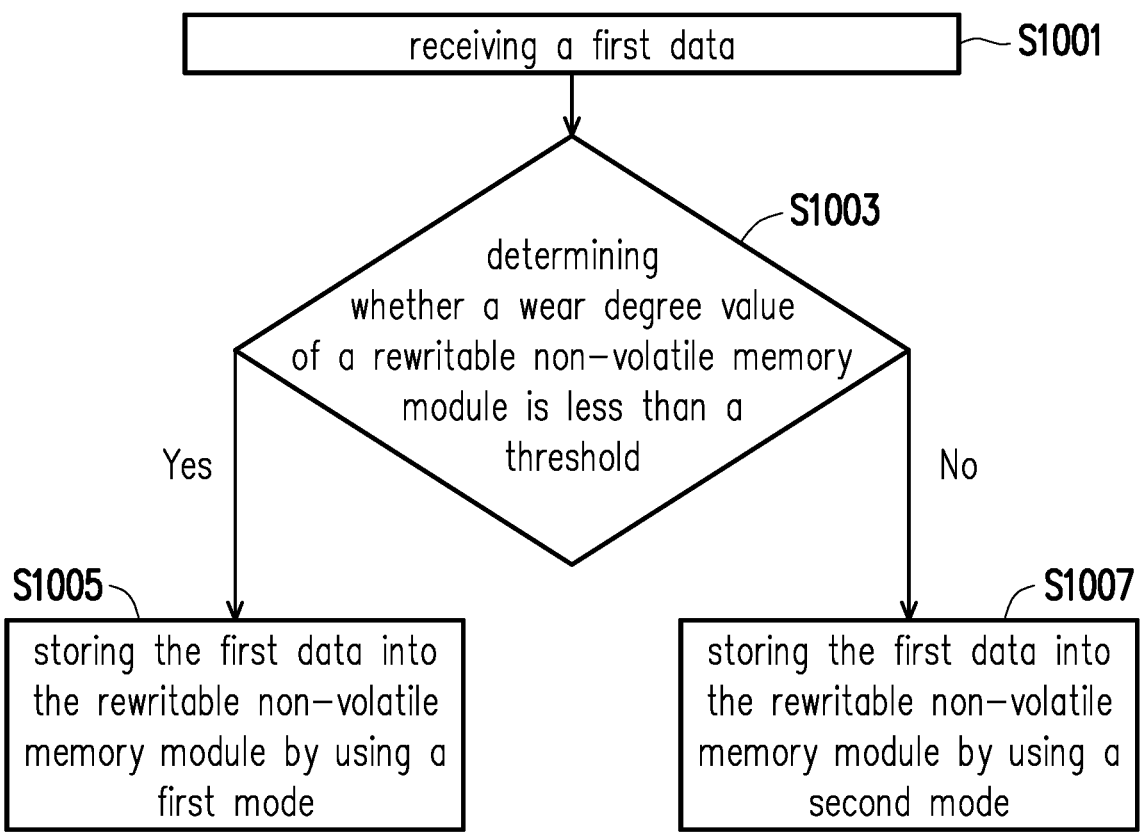
FIG. 10 is a flowchart illustrating a data storing method according to an exemplary embodiment.

FIG. 10 is a flowchart illustrating a data storing method according to an exemplary embodiment.

Referring to FIG. 10, in step S1001, the MMC 702 receives first data. In step S1003, the MMC 702 determines whether the wear degree value of the RNVM module 406 is less than a threshold. If the wear degree value of the RNVM module 406 is less than the threshold, in step S1005, the MMC 702 stores the first data into the RNVM module 406 by using the a mode. If the wear degree value of the RNVM module 406 is not less than the threshold, in step S1007, the MMC 702 stores the first data into the RNVM module 406 by using a second mode. In particular, a reliability of the first data stored by using the first mode is higher than a reliability of the first data stored by using the second mode.

The data storing method of the present invention will be described below in a number of different embodiments.

First Embodiment

In the first embodiment of the present invention, when a write command indicating storing the first data into the RNVM module 406 is received from the host system 11, the MMC 702 would determine whether the wear degree value of the RNVM module 406 is less than the threshold T1. When the wear degree value of the RNVM module 406 is less than the threshold T1, the MMC 702 uses the first mode to store the first data into the RNVM module 406.

In the first mode of the first embodiment, the MMC 702 extracts at least one PEU (also referred to as a first PEU) from the free area 504, and uses a single-page mode (also referred to as a first programming mode) to store the first data temporarily to a lower PPU of the first PEU. Thereafter, at an appropriate time (e.g., when the lower PPU of the first PEU is full), the MMC 702 can extract at least one PEU (also referred to as a second PEU) from the free area 504 and write the first data in the first PEU to the second PEU by using a multi-page mode (also referred to as a second programming mode). Thereafter, the MMC 702 can associate the aforementioned second erasing unit into the data area 502.

In particular, in the exemplary embodiment, after the first data in the first PEU is written into the second PEU by using the multi-page mode, the MMC 702 does not erase the first data stored in the first PEU, thereby improving the reliability of data storage. In detail, when writing the first data in the first PEU to the second PEU, the MMC 702 may perform an encoding operation according to the first data to generate an encoded data corresponding to the first data. Thereafter, when the MMC 702 reads the first data in the second PEU, the MMC 702 can determine whether the first data stored in the second PEU has an error bit that cannot be corrected according to the encoded data generated when writing the first data to the second PEU. When the error bit that cannot be corrected exists in the first data stored in the second PEU, the MMC 702 can read the first data originally stored in the first PEU. In this way, it can ensure the reliability of the data written when the wear degree value of the RNVM module 406 is less than the threshold T1. In addition, the method for determining whether the stored data has an error bit that cannot be corrected according to the encoded data can be known by a conventional technique, and details are not described herein again.

In addition, when a write command indicating storing the first data into the RNVM module 406 is received from the host system 11 and the wear degree value of the RNVM module 406 is not less than the threshold, the MMC 702 would directly use the second mode to store the first data into the RNVM module 406. In the second mode of the first embodiment, the MMC 702 extracts at least one PEU (also referred to as a third PEU) from the free area 504, and directly uses the second programming mode to write the first data into the aforementioned third PEU. Thereafter, the MMC 702 can associate the aforementioned third PEU into the data area 502.

When writing the first data into the third PEU, the MMC 702 may perform an encoding operation according to the first data to generate encoded data corresponding to the first data. When the MMC 702 reads the first data in the third PEU, it can determine whether the first data in the third PEU has an error bit that cannot be corrected according to the encoded data. It should be noted that, in the second mode of the first embodiment, since the MMC 702 directly writes the first data into the third PEU by using the multi-page mode without using the single-page mode firstly to write the first data into other PEU, when there is the error bit that cannot be corrected in the first data in the third PEU, the MMC 702 does not read the first data written by using the single-page mode.

Here, the single-page mode refers to storing data only by using the lower PPUs. Namely, in the single-page mode, the MMC 702 merely performs the data writing operation into the lower PPUs. Since the temporary PEUs are operated in the single-page mode, in the present exemplary embodiment, only ⅓ of a temporary PEU is used, and a temporary PEU group corresponding to one logical unit contains 3 temporary PEUs to provide a sufficient space for storing data of a logical unit. In the present exemplary embodiment, the MMC 702 uses the single-page mode to operate the PEUs in the free area 504.

The multi-page mode refers to storing data by using the lower PPU, the middle PPU and the upper PPU. Namely, when writing data by using the multi-page mode, the MMC 702 performs programming on the lower PPU, the middle PPU and the upper PPU belonging to one same PPU group. It is to be mentioned that in an exemplary embodiment, when using the multi-page mode to operate the PEUs, the PPUs belonging to the same PPU group are programmed simultaneously or in phases. In the present exemplary embodiment, the MMC 702 operates the PEUs associated with the data area 502 by using the multi-page mode.

Figure 11:
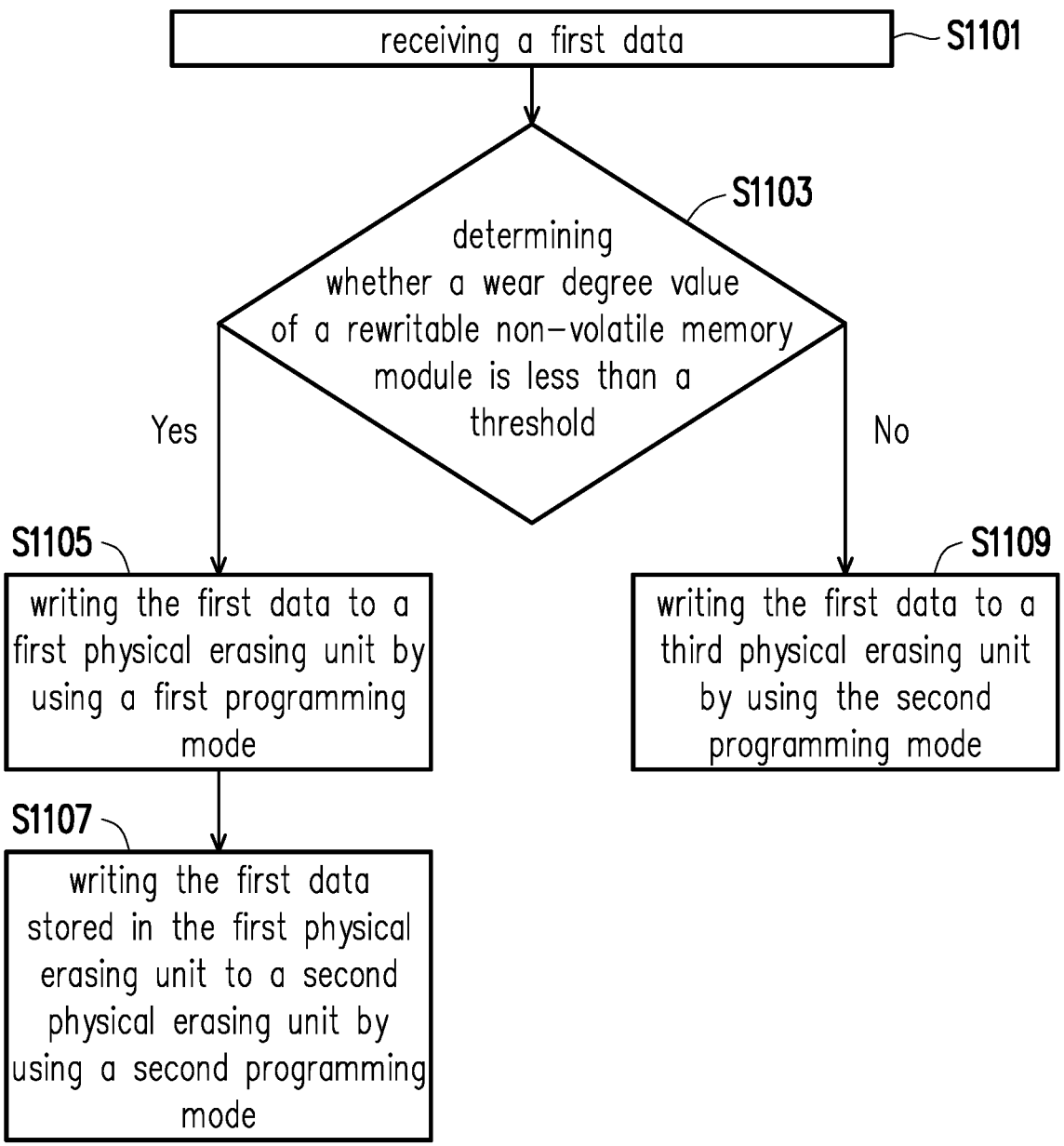
FIG. 11 is a flowchart of a data storing method according to a first exemplary embodiment.

FIG. 11 is a flowchart of a data storing method according to a first exemplary embodiment.

Referring to FIG. 11, in step S1101, the MMC 702 receives the first data. In step S1103, the MMC 702 determines whether the wear degree value of the RNVM module 406 is less than the threshold T1. When the wear degree value of the RNVM module 406 is less than the threshold T1, in step S1105, the MMC 702 writes the first data to the first PEU by using the first programming mode. Then in step S1107, the MMC 702 writes the first data stored in the first PEU to the second PEU by using the second programming mode. In addition, when the wear degree value of the RNVM module 406 is not less than the threshold T1, in step S1109, the MMC 702 writes the first data to the third PEU by using the second programming mode.

Second Embodiment

In the second embodiment of the present invention, when receiving a write command indicating storing the first data into the RNVM module 406 from the host system 11, the MMC 702 determines whether the wear degree value of the RNVM module 406 is less than the threshold T1. When the wear degree value of the RNVM module 406 is less than the threshold T1, the MMC 702 performs an encoding operation (also referred to as a first encoding operation) to generating encoded data (also referred to as first encoded data) corresponding to the first data, and storing the first data and the first encoded data into the RNVM module 406. In addition, when receiving the write command indicating storing the first data into the RNVM module 406 from the host system 11 and the wear degree value of the RNVM module 406 is not less than the threshold T1, the MMC 702 performs another encoding operation (also referred to as a second encoding operation) to generate encoded data (also referred to as the second encoded data) corresponding to the first data, and storing the first data and the second encoded data into the RNVM module 406.

In the second embodiment, the first encoded data and the second encoded data are respectively used to correct error bits of the first data stored in the RNVM module 406. In particular, the first encoded data generated by the first encoding operation has an error checking and correction capability that is higher than the error checking and correcting capability of the second encoded data generated by the second encoding operation. For example, the quantity of error bits (also referred to as a first quantity) that the first encoded data can correct is higher than the quantity of error bits (also referred to as a second quantity) that the second encoded data can correct. In this way, it is possible to ensure the reliability of the data written when the wear degree value of the RNVM module 406 is less than the threshold T1. In the second embodiment, the first encoding operation is, for example, an encoding operation based on a BCH algorithm and the second encoding operation is, for example, an encoding operation based on an LDPC algorithm. However, the present invention is not intended to limit algorithms used by the first encoding operation and the second encoding operation.

Figure 12:
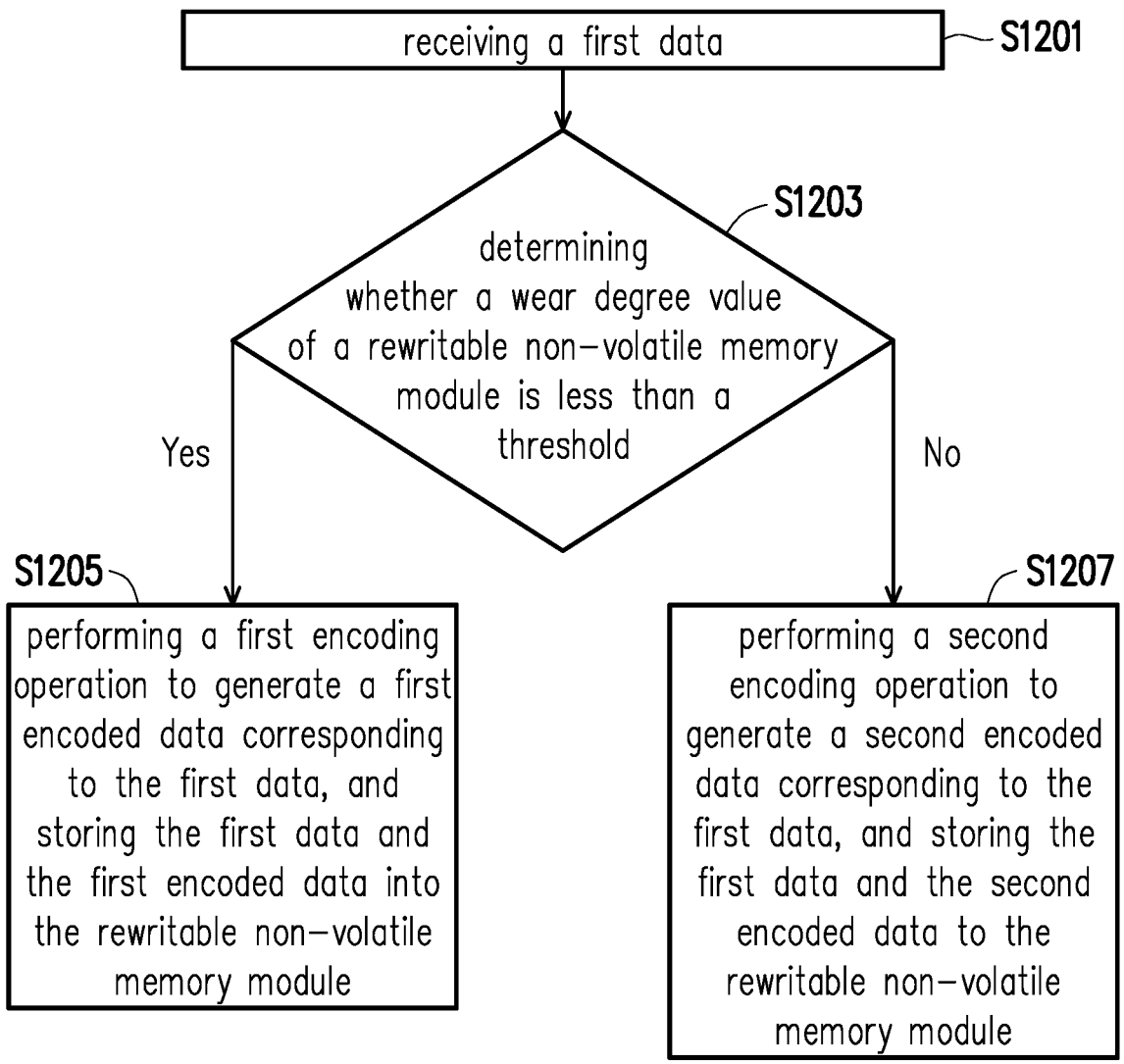
FIG. 12 is a flowchart of a data storing method according to a second exemplary embodiment.

FIG. 12 is a flowchart of a data storing method according to a second exemplary embodiment.

Referring to FIG. 12, in step S1201, the MMC 702 receives the first data. In step S1203, the MMC 702 determines whether the wear degree value of the RNVM module 406 is less than the threshold T1. When the wear degree value of the RNVM module 406 is less than the threshold T1, in step S1205, the MMC 702 performs the first encoding operation to generate the first encoded data corresponding to the first data and stores the first data and the first encoded data into the RNVM module 406. When the wear degree value of the RNVM module 406 is not less than the threshold T1, in step S1207, the MMC 702 performs the second encoding operation to generate the second encoded data corresponding to the first data and stores the first data and the second encoded data to the RNVM module 406. In particular, the first encoded data and the second encoded data are respectively used to correct error bits of the first data stored in the RNVM module 406, and the first quantity of error bits that can be corrected by the first encoded data is higher than the second quantity of error bits that can be corrected by the second encoded data.

Third Embodiment

In the third embodiment of the present invention, when receiving a write command indicating storing a first data to the RNVM module 406 from the host system 11, the MMC 702 determines whether the wear degree value of the RNVM module 406 is less than the threshold T1. When the wear degree value of the RNVM module 406 is less than the threshold T1, the MMC 702 performs a compression operation (also referred to as a first compression operation) to generate compressed data (also referred to as first compressed data) corresponding to the first data. Thereafter, the MMC 702 stores the first compressed data into the RNVM module 406. In addition, when the write command indicating storing the first data to the RNVM module 406 is received from the host system 11 and the wear degree value of the RNVM module 406 is not less than the threshold T1, the MMC 702 performs another compression operation (also referred to as a second compression operation) to generate compressed data (also referred to as second compressed data) corresponding to the first data. Thereafter, the MMC 702 stores the second compressed data to the RNVM module 406.

The method of compressing data to generate compressed data can be known by conventional techniques and will not be described herein. In particular, in the third embodiment, the size of the first compressed data is smaller than the size of the second compressed data. In other words, assuming that there is a space (also referred to as the first space) with the same size for storing the first data, since the first compressed data of the first mode is small, there may be more space in the first space to store the encoded data corresponding to the first data. In addition, since the second compressed data of the second mode is larger, there is only less space in the first space to store the encoded data corresponding to the first data. In general, the size of the encoded data is proportional to the capability of the error checking and correcting of encoded data. Therefore, in the case where the first compressed data is smaller, the larger encoded data can be stored to ensure that the reliability of the data written when the wear degree value of the RNVM module 406 is less than the threshold T1.

Figure 13:
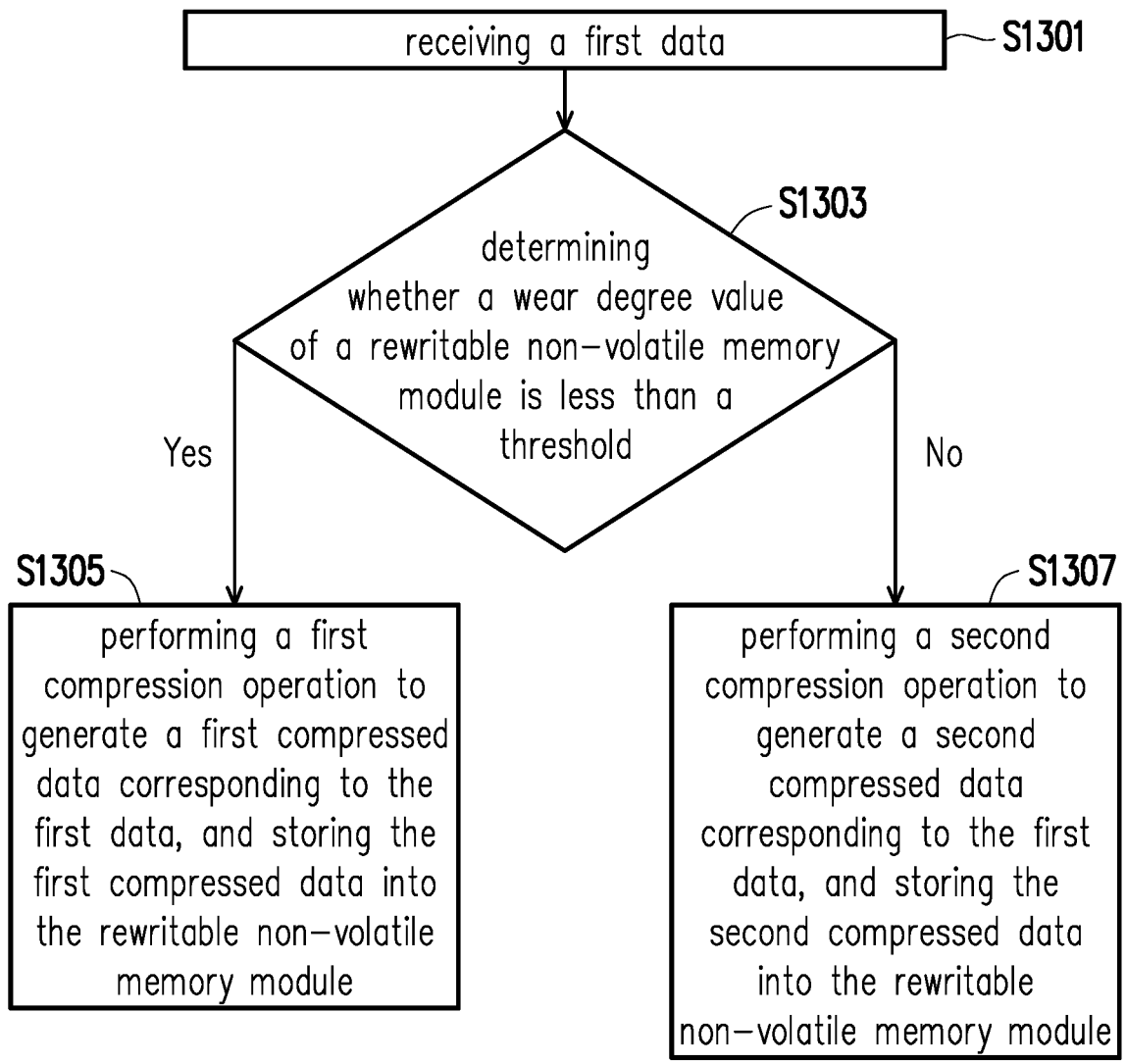
FIG. 13 is a flowchart of a data storing method according to a third exemplary embodiment.

FIG. 13 is a flowchart of a data storing method according to a third exemplary embodiment.

Referring to FIG. 13, in step S1301, the MMC 702 receives the first data. In step S1303, the MMC 702 determines whether the wear degree value of the RNVM module 406 is less than the threshold T1. When the wear degree value of the RNVM module 406 is less than the threshold T1, in step S1305, the MMC 702 performs the first compression operation to generate the first compressed data corresponding to the first data and stores the first compressed data into the RNVM module 406. When the wear degree value of the RNVM module 406 is not less than the threshold T1, in step S1307, the MMC 702 performs the second compression operation to generate the second compressed data corresponding to the first data and stores the second compressed data into the RNVM module 406. In particular, the size of the first compressed data is smaller than the size of the second compressed data.

In summary, the data storing method, the memory controlling circuit unit, and the memory storage device of the present invention can directly use a RNVM module without extensive testing of the RNVM module and ensure the correctness of the data stored in the RNVM module. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data storing method for a rewritable non-volatile memory module, wherein the rewritable non-volatile memory module comprises a plurality of physical erasing units, the data storing method comprising:
   receiving a first data;
   determining whether a wear degree value of the rewritable non-volatile memory module is less than a threshold, wherein the wear degree value is a sum of a number of erases and a number of writes of the plurality of physical erasing units in the rewritable non-volatile memory module;
   if the wear degree value of the rewritable non-volatile memory module is less than the threshold, storing the first data into the rewritable non-volatile memory module by using a first mode; and
   if the wear degree value of the rewritable non-volatile memory module is not less than the threshold, storing the first data into the rewritable non-volatile memory module by using a second mode,
   wherein a reliability of the first data stored by using the first mode is higher than a reliability of the first data stored by using the second mode,
   wherein the rewritable non-volatile memory module comprises a minimum wear degree value and a maximum wear degree value, the minimum wear degree value differs from the maximum wear degree value by a first value, the threshold differs from the minimum wear degree value by a second value, and the second value is one tenth of the first value.

2. The data storing method of claim 1, wherein each physical erasing unit among the plurality of physical erasing units comprises a plurality of physical programming units, wherein the step of storing the first data into the rewritable non-volatile memory module by using the first mode comprises:
   writing the first data to a first physical erasing unit of the plurality of physical erasing units by using a first programming mode; and
   writing the first data stored in the first physical erasing unit to a second physical erasing unit of the plurality of physical erasing units by using a second programming mode.

3. The data storing method of claim 2, further comprising:
   determining whether the first data in the second physical erasing unit has an error bit that cannot be corrected; and
   if the first data stored in the second physical erasing unit has the error bit that cannot be corrected, reading the first data stored in the first physical erasing unit.

4. The data storing method of claim 3, wherein the step of storing the first data into the rewritable non-volatile memory module by using the second mode comprises:
   writing the first data to a third physical erasing unit of the plurality of physical erasing units by using the second programming mode; and
   determining whether the first data in the third physical erasing unit has an error bit that cannot be corrected.

5. The data storing method of claim 1, wherein the step of storing the first data into the rewritable non-volatile memory module by using the first mode comprises:
   performing a first encoding operation to generate a first encoded data corresponding to the first data, and storing the first data and the first encoded data into the rewritable non-volatile memory module,
   wherein the step of storing the first data into the rewritable non-volatile memory module by using the second mode comprises:
   performing a second encoding operation to generate a second encoded data corresponding to the first data, and storing the first data and the second encoded data to the rewritable non-volatile memory module,
   wherein the first encoded data and the second encoded data are respectively used to correct error bits of the first data stored in the rewritable non-volatile memory module, and a first quantity of the error bits that can be corrected by the first encoded data is higher than a second quantity of the error bits that can be corrected by the second encoded data.

6. The data storing method of claim 1, wherein the step of storing the first data into the rewritable non-volatile memory module by using the first mode comprises:
   performing a first compression operation to generate a first compressed data corresponding to the first data, and storing the first compressed data into the rewritable non-volatile memory module,
   wherein the step of storing the first data into the rewritable non-volatile memory module by using the second mode comprises:
   performing a second compression operation to generate a second compressed data corresponding to the first data, and storing the second compressed data into the rewritable non-volatile memory module,
   wherein a size of the first compressed data is smaller than a size of the second compressed data.

7. A memory controlling circuit unit for a rewritable non-volatile memory module, wherein the rewritable non-volatile memory module comprises a plurality of physical erasing units, the memory controlling circuit unit comprising:
- a host interface, configured to couple to a host system;
- a memory interface, configured to couple to the rewritable non-volatile memory module; and
- a memory management circuit, coupled to the host interface and the memory interface,
- wherein the memory management circuit is configured to receive a first data,
- wherein the memory management circuit is further configured to determine whether a wear degree value of the rewritable non-volatile memory module is less than a threshold, wherein the wear degree value is a sum of a number of erases and a number of writes of the plurality of physical erasing units in the rewritable non-volatile memory module,
- when the wear degree value of the rewritable non-volatile memory module is less than the threshold, the memory management circuit is further configured to store the first data into the rewritable non-volatile memory module by using a first mode, and
- when the wear degree value of the rewritable non-volatile memory module is not less than the threshold, the memory management circuit is further configured to store the first data into the rewritable non-volatile memory module by using a second mode,
- wherein a reliability of the first data stored by using the first mode is higher than a reliability of the first data stored by using the second mode,
- wherein the rewritable non-volatile memory module comprises a minimum wear degree value and a maximum wear degree value, the minimum wear degree value differs from the maximum wear degree value by a first value, the threshold differs from the minimum wear degree value by a second value, and the second value is one tenth of the first value.

8. The memory controlling circuit unit of claim 7, wherein each physical erasing unit among the plurality of physical erasing units comprises a plurality of physical programming units, wherein in the operation of storing the first data into the rewritable non-volatile memory module by using the first mode,
- the memory management circuit is further configured to write the first data to a first physical erasing unit of the plurality of physical erasing units by using a first programming mode, and
- the memory management circuit is further configured to write the first data stored in the first physical erasing unit to a second physical erasing unit of the plurality of physical erasing units by using a second programming mode.

9. The memory controlling circuit unit of claim 8, wherein the memory management circuit is further configured to determine whether the first data in the second physical erasing unit has an error bit that cannot be corrected, and if the first data stored in the second physical erasing unit has the error bit that cannot be corrected, the memory management circuit is further configured to read the first data stored in the first physical erasing unit.

10. The memory controlling circuit unit of claim 9, wherein in the operation of storing the first data into the rewritable non-volatile memory module by using the second mode,

- the memory management circuit is further configured to write the first data to a third physical erasing unit of the plurality of physical erasing units by using the second programming mode, and
- the memory management circuit is further configured to determine whether the first data in the third physical erasing unit has an error bit that cannot be corrected.

11. The memory controlling circuit unit of claim 7, wherein in the operation of storing the first data into the rewritable non-volatile memory module by using the first mode,
- the memory management circuit is further configured to perform a first encoding operation to generate a first encoded data corresponding to the first data, and store the first data and the first encoded data into the rewritable non-volatile memory module,
- wherein in the operation of storing the first data into the rewritable non-volatile memory module by using the second mode,
- the memory management circuit is further configured to perform a second encoding operation to generate a second encoded data corresponding to the first data, and store the first data and the second encoded data to the rewritable non-volatile memory module,
- wherein the first encoded data and the second encoded data are respectively used to correct error bits of the first data stored in the rewritable non-volatile memory module, and a first quantity of the error bits that can be corrected by the first encoded data is higher than a second quantity of the error bits that can be corrected by the second encoded data.

12. The memory controlling circuit unit of claim 7, wherein in the operation of storing the first data into the rewritable non-volatile memory module by using the first mode,
- the memory management circuit is further configured to perform a first compression operation to generate a first compressed data corresponding to the first data, and store the first compressed data into the rewritable non-volatile memory module,
- wherein in the operation of storing the first data into the rewritable non-volatile memory module by using the second mode,
- the memory management circuit is further configured to perform a second compression operation to generate a second compressed data corresponding to the first data, and store the second compressed data into the rewritable non-volatile memory module,
- wherein a size of the first compressed data is smaller than a size of the second compressed data.

13. A memory storage device, comprising:
- a connection interface unit, configured to couple to a host system;
- a rewritable non-volatile memory module, wherein the rewritable non-volatile memory module comprises a plurality of physical erasing units; and
- a memory controlling circuit unit, coupled to the connection interface unit and the rewritable non-volatile memory module,
- wherein the memory controlling circuit unit is configured to receive a first data,
- wherein the memory controlling circuit unit is further configured to determine whether a wear degree value of the rewritable non-volatile memory module is less than a threshold, wherein the wear degree value is a sum of a number of erases and a number of writes of the plurality of physical erasing units in the rewritable non-volatile memory module, if the wear degree value of the rewritable non-volatile memory module is less than the threshold, the memory controlling circuit unit is further configured to store the first data into the rewritable non-volatile memory module by using a first mode, and if the wear degree value of the rewritable non-volatile memory module is not less than the threshold, the memory controlling circuit unit is further configured to store the first data into the rewritable non-volatile memory module by using a second mode, wherein a reliability of the first data stored by using the first mode is higher than a reliability of the first data stored by using the second mode, wherein the rewritable non-volatile memory module comprises a minimum wear degree value and a maximum wear degree value, the minimum wear degree value differs from the maximum wear degree value by a first value, the threshold differs from the minimum wear degree value by a second value, and the second value is one tenth of the first value.

14. The memory storage device of claim 13, wherein each physical erasing unit among the plurality of physical erasing units comprises a plurality of physical programming units, wherein in the operation of storing the first data into the rewritable non-volatile memory module by using the first mode, the memory controlling circuit unit is further configured to write the first data to a first physical erasing unit of the plurality of physical erasing units by using a first programming mode, and the memory controlling circuit unit is further configured to write the first data stored in the first physical erasing unit to a second physical erasing unit of the plurality of physical erasing units by using a second programming mode.

15. The memory storage device of claim 14, wherein the memory controlling circuit unit is further configured to determine whether the first data in the second physical erasing unit has an error bit that cannot be corrected, and if the first data stored in the second physical erasing unit has the error bit that cannot be corrected, the memory controlling circuit unit is further configured to read the first data stored in the first physical erasing unit.

16. The memory storage device of claim 15, wherein in the operation of storing the first data into the rewritable non-volatile memory module by using the second mode, the memory controlling circuit unit is further configured to write the first data to a third physical erasing unit of the plurality of physical erasing units by using the second programming mode, and the memory controlling circuit unit is further configured to determine whether the first data in the third physical erasing unit has an error bit that cannot be corrected.

17. The memory storage device of claim 13, wherein in the operation of storing the first data into the rewritable non-volatile memory module by using the first mode, the memory controlling circuit unit is further configured to perform a first encoding operation to generate a first encoded data corresponding to the first data, and store the first data and the first encoded data into the rewritable non-volatile memory module, wherein in the operation of storing the first data into the rewritable non-volatile memory module by using the second mode, the memory controlling circuit unit is further configured to perform a second encoding operation to generate a second encoded data corresponding to the first data, and store the first data and the second encoded data to the rewritable non-volatile memory module, wherein the first encoded data and the second encoded data are respectively used to correct error bits of the first data stored in the rewritable non-volatile memory module, and a first quantity of the error bits that can be corrected by the first encoded data is higher than a second quantity of the error bits that can be corrected by the second encoded data.

18. The memory storage device of claim 13, wherein in the operation of storing the first data into the rewritable non-volatile memory module by using the first mode, the memory controlling circuit unit is further configured to perform a first compression operation to generate a first compressed data corresponding to the first data, and store the first compressed data into the rewritable non-volatile memory module, wherein in the operation of storing the first data into the rewritable non-volatile memory module by using the second mode, the memory controlling circuit unit is further configured to perform a second compression operation to generate a second compressed data corresponding to the first data, and store the second compressed data into the rewritable non-volatile memory module, wherein a size of the first compressed data is smaller than a size of the second compressed data.

* * * * *